United States Patent [19]
Fuller et al.

[11] Patent Number: 5,432,747
[45] Date of Patent: Jul. 11, 1995

[54] SELF-TIMING CLOCK GENERATOR FOR PRECHARGED SYNCHRONOUS SRAM

[75] Inventors: Douglas A. Fuller, Eagan; Duane A. Schroeder, White Bear Lake; Kenichi Tsuchiya, New Brighton, all of Minn.

[73] Assignee: Unisys Corporation, Blue Bell, Pa.

[21] Appl. No.: 306,096

[22] Filed: Sep. 14, 1994

[51] Int. Cl.⁶ .................................................. G11C 7/00
[52] U.S. Cl. ............................... 365/203; 365/189.05; 365/233
[58] Field of Search ............. 365/203, 201, 233, 189.05

[56] References Cited

U.S. PATENT DOCUMENTS

| | | | |
|---|---|---|---|
| 4,612,631 | 9/1986 | Ochii | 365/203 |
| 4,638,462 | 1/1987 | Rajeerakumar | 365/203 |
| 4,794,570 | 12/1988 | Rose et al. | 365/203 |
| 4,856,106 | 8/1989 | Teraoka | 365/203 |
| 4,914,633 | 4/1990 | Rose et al. | 365/203 |
| 4,943,960 | 7/1990 | Komatsu et al. | 365/222 |
| 5,029,135 | 7/1991 | Okubo | 365/203 |
| 5,229,970 | 7/1993 | Lee et al. | 365/222 |
| 5,262,998 | 11/1993 | Mnich et al. | 365/222 |
| 5,315,557 | 5/1994 | Kim et al. | 365/222 |

FOREIGN PATENT DOCUMENTS 406096575  4/1994  Japan ................... 365/203

*Primary Examiner*—David C. Nelms
*Assistant Examiner*—Son Dinh
*Attorney, Agent, or Firm*—Steven R. Funk; Charles A. Johnson; Mark Starr

[57] ABSTRACT

A self-timing clock generator for use with a precharged Static Random Access Memory (SRAM). The invention asynchronously switches the memory clock pulse to a precharge signal upon recognition of completion of a memory access cycle. Recognition of completion of the memory access cycle is performed in one of two ways. The first method monitors for the existence of a preprogrammed memory-completion bit which becomes active at the same time that read or write data becomes valid at the data outputs. The second method monitors for the existence of a memory-completion bit generated through the use of an odd parity generator. An alternate clocking method is provided to bypass the asynchronous self-timing clock generator, and to allow for synchronous clocking of the precharged SRAM. An external clocking method is also provided to directly clock the precharged SRAM. Finally, the self-timing clock generator and the precharged SRAM may be tested through the use of a test enable circuit, which intercepts the generated precharge and clock signals, and provides in place thereof a test precharge and clock signal.

14 Claims, 7 Drawing Sheets

SELF-TIMING CLOCK GENERATOR FOR PRECHARGED SYNCHRONOUS SRAM

BACKGROUND OF THE INVENTION

1. Field of the Invention

This invention relates to activation of precharged SRAMs, and more particularly to self-activation of precharged SRAMS through the use of a self-timing clock generator.

2. Description of the Prior Art

The reduction of power consumption and the escalation of digital component speed are significant concerns with modern digital circuitry. This is due to significant increases in gate densities particularly with Very Large Scale Integrated Circuits (VLSI) such as Application Specific Integrated Circuits (ASICs). In order to help reduce the power density of such VLSIs/ASICs and increase speed in a digital system using Static Random Access Memory (SRAM) chips, "precharged" SRAMs may be used. A precharged Static Random Access Memory (SRAM) is a memory device which places a memory block into a low power "precharge" mode when it is not accessed, and sets precharged SRAM outputs to a known logic state while in a "precharge" mode. This power reduction has enabled SRAMs to be implemented in higher density and with smaller gates and cells. This allows the precharged SRAM to give a higher performance.

In order to precharge a precharged SRAM for reading and writing data, an activation or "precharge" signal must be received by the precharged SRAM. This signal must be present for a specified duration in order to precharge the precharged SRAM to perform data reads and writes. Precharging will be terminated when a read or write function is initiated. The precharged SRAM of the preferred embodiment has a clock input for receiving the triggering clock edge to clock memory reads and writes. The same clock input also receives the precharge signal to precharge the device. The logic state of the signal (hereinafter referred to as the precharge/clock signal) at the clock input of the precharged SRAM determines whether the device is being precharged, or is being clocked. For example, a low precharge/clock signal will precharge the device, while a low-to-high transition will clock the device to perform memory read and write functions.

In order to precharge and clock the precharged SRAM, an oscillating clock signal can be generated to directly clock and precharge the SRAM. However, by supplying a fixed frequency, fixed duty cycle clock signal to the clock input, a worst-case timing analysis must be performed to calculate the fastest clock signal that can be safely used to obtain the required precharge and clocking times. Therefore, it would be advantageous to know when a memory read or memory write has completed, so that precharging can immediately begin. Where completion of the memory cycle is known, worst case analysis would not be required for memory access times, since the "actual" time of completion of a memory read or write would be known.

The present invention reduces the time between memory reads and writes by affording a method of discerning the completion of a memory read or write cycle, which allows precharging to begin as soon as the memory read or write has completed. This is performed by initially latching the active level of a clock signal, and resetting the latch upon completion of the memory read or write. This "self-timed" clock generator therefore switches the state of the signal at the clock input to precharge mode at the earliest possible time, and therefore allows precharging of the memory device to be as long as possible before the next read or write activity. The memory device will begin precharging at an earlier time than where worst-case memory cycle times are used to initiate precharging.

Where a precharged SRAM is embedded in an Application-Specific Integrated Circuit (ASIC), it is desirable to have less than 50% duty cycles for clock signals having very high frequencies. This is because extended periods of a high logic level can cause "hot spots" in the ASIC, which can cause damage to the component. The self-timed clock generator of the present invention provides the smallest duty cycle possible, since the precharge/clock signal will drop to a low logic level as soon as the data is valid for a read or write cycle. The duty cycle reduction of the precharge/clock signal also has the effect of lowering total power consumption. The self-timing operation of the present invention also allows the minimum precharge time of the precharged SRAM to be more easily met, and allows greater system clock speeds than where precharging begins following a worst-case synchronous timing period.

A "Self-Timed Precharge Circuit" is disclosed in U.S. Pat. No. 4,638,462, by Rajeevakumar et al., issued Jan. 20, 1987. The Rajeevakumar et al. design utilizes a self-timed precharge circuit and multiple falling-edge detectors to generate the precharge signal. Activation of the precharge signal occurs when a particular word line goes from the active to the inactive state. This occurs when the memory address becomes inactive, and in turn inactivates the word line. The inactivation of the word line is detected by the word line's respective falling-edge detector, which then activates the precharge signal.

The present invention is designed to activate the precharge signal at a time prior to that of a precharge circuit of the type disclosed by Rajeevakumar et al. The present design avoids the use of a falling-edge detector for every row in a memory array. The goal of the present invention is to activate the precharge signal as soon as possible after a data access cycle has completed. Therefore, rather than wait until the address becomes inactive, the present invention has circuitry to activate the precharge signal as soon as the data is valid. The advantages of doing so were previously described, which include reducing power consumption, and potentially allowing for increased clock speeds since the active clock pulse width is minimized.

A self-timing precharge circuit is also disclosed in U.S. Pat. No. 4,914,633, by Rose et al., issued Apr. 3, 1987. This patent, entitled "Self-Timed Programmable Logic Array With Precharge Circuit", has an internal timing circuit for indicating when the output signals are valid. However, the timing circuit generates an output enabling signal a "predetermined time" later to enable downstream circuitry to use the output signals. The present invention differs from Rose et al. because this predetermined time delay is precisely what the present invention is designed to avoid. The present invention activates the precharge signal almost immediately upon completion of a data read or write cycle, and therefore is not forced to wait until the end of the address cycle.

Apart from precharge signal concerns, it is important to be able to test the memory device to ensure that precharged SRAM activity is working as designed. It is also important to be able to monitor the system in which the precharged SRAM resides for faults or for determining the current status of the system. For these cases, the present invention provides a "test enable" circuit that will disable the self-timed clock generator. This circuit also provides means for clocking the precharged SRAM with an external test clock.

The self-timing clock generator of the present invention allows the precharge signal to be activated as soon as valid data is present on the data bus. This allows a reduction of power consumption due to a longer low voltage period on the precharge/clock signal. Minimizing the logic high period for the precharge/clock signal reduces the chance of damage to the ASIC. Furthermore, the minimum precharge time is more easily met where the precharge signal is activated as soon as the read or write data is valid. This can potentially allow for increased clock speeds, and increased system speeds as the semiconductor process and technology matures and/or improves. These advantages, coupled with the ability to test the precharged SRAM, establish the novelty of the present invention.

OBJECTS

It is a primary objective of this invention to provide an improved digital clocking system for a precharged static random access memory device.

It is another object of the present invention to provide a self-timing clock generator which reduces power consumption, minimizes the logic high period on the precharge signal, and provides potential improved system clock speed.

It is still another object to provide a precharged SRAM clock generator which is self-timed, and automatically and asynchronously switches tile precharged static random access memory from clocking mode to precharge mode.

Another object of the invention is to provide self-timing of a precharged SRAM using minimal circuitry.

Yet another object of the present invention is to activate the precharge signal as soon as valid data is present on the data bus.

It is another object of the invention to provide testing capabilities, for testing the self-timing clock generator and the precharged SRAM.

Another object of the present invention is to provide an alternate clocking mechanism to allow for synchronous self-timing of the precharged SRAM.

It is yet another object to provide external clocking means to bypass the self-timing clock generator, and allow direct clocking from an external clock source.

Other more detailed objectives will become apparent from a consideration of the Drawings and the Detailed Description of the Preferred Embodiment.

SUMMARY OF THE INVENTION

The Self-Timing Clock Generator For Precharged Synchronous SRAM supplies digital clock and precharge signals to a precharged SRAM. The invention provides the digital clock signal to the SRAM to perform memory read and write functions, while maximizing the SRAM precharging period. The precharge period is maximized by asynchronously switching the clock pulse to the precharge signal level upon recognition of valid read or write data. This allows the minimum precharging period to be more quickly met, while reducing overall power consumption.

The invention asynchronously switches an active clock pulse to a precharge signal upon completion of a memory access cycle. This is accomplished by monitoring a memory-completion bit. In one embodiment of the invention, the memory-completion bit is designed as part of the data word which is to be read or written. One or more bits of the data word are preprogrammed at a predetermined logic level. When data which is read or written becomes valid at the data outputs, the memory-completion bit will simultaneously be valid. Recognition of the memory-completion bit during a read or write cycle will cause the active clock pulse to switch to the opposite logic level, which is the logic level required to precharge the SRAM.

In another embodiment of the invention, the memory-completion bit is generated through the use of an odd parity bit. Rather than preprogramming the memory-completion bit, an odd parity bit may be stored as part of a written data word. Then, all data word bits and the odd parity bit are OR'ed at the data output to generate a memory-completion bit. Since odd parity is used, the odd parity bit is always a logic high where an even number of bits of the data word are high, and the odd parity bit is always a logic low where an odd number of bits of the data word are high. In this way, at least one of the data word bits or the odd parity bit is guaranteed to be at a high logic level. Upon recognition of this high logic level, the OR function will generate a memory-completion bit. This embodiment of the invention is more practical and economical where an odd parity generator already exists in the system to monitor data parity.

The present invention also allows testing of the self-timing clock generator and the associated precharged SRAM. Where the SRAM is embedded within a larger ASIC, it is important to be able to test it independently from the rest of the ASIC so that hardware defects can be discovered prior to actual use in the system. Therefore, a test enable circuit is provided to intercept the actual clock and precharge signals, and to supply external clock and precharge signals in their place. Circuitry also exists to intercept the write enable signal, and to supply an external write enable signal. In this way, greater control of clocking the SRAM may be achieved, and functionality and timing tests may be performed on the SRAM.

Testing of the self-timing clock generator itself is also possible due to alternate and external clocking circuitry. An alternate clocking scheme is provided to bypass the circuitry providing the asynchronous precharge signal. Synchronous clocking and precharging of the SRAM can be provided using the alternate clocking scheme. An external clock is also provided to bypass all circuitry, and allow the external clock to directly clock the precharged SRAM. These clocking methods allow for testing of the self-timing clock generator, and provide backup clocking mechanisms in the event that the self-timing clock generator fails.

Still other objects and advantages of the present invention will become readily apparent to those skilled in this art from the following detailed description, where the preferred embodiment of the invention is shown by way of illustration of the best mode contemplated of carrying out the invention. As will be realized, the invention is capable of other and different embodiments, and its details are capable of modification without departing from the invention. Accordingly, the drawing and description are to be regarded as illustrative in nature, and not as restrictive.

DETAILED DESCRIPTION OF THE PREFERRED EMBODIMENT

Figure 1:
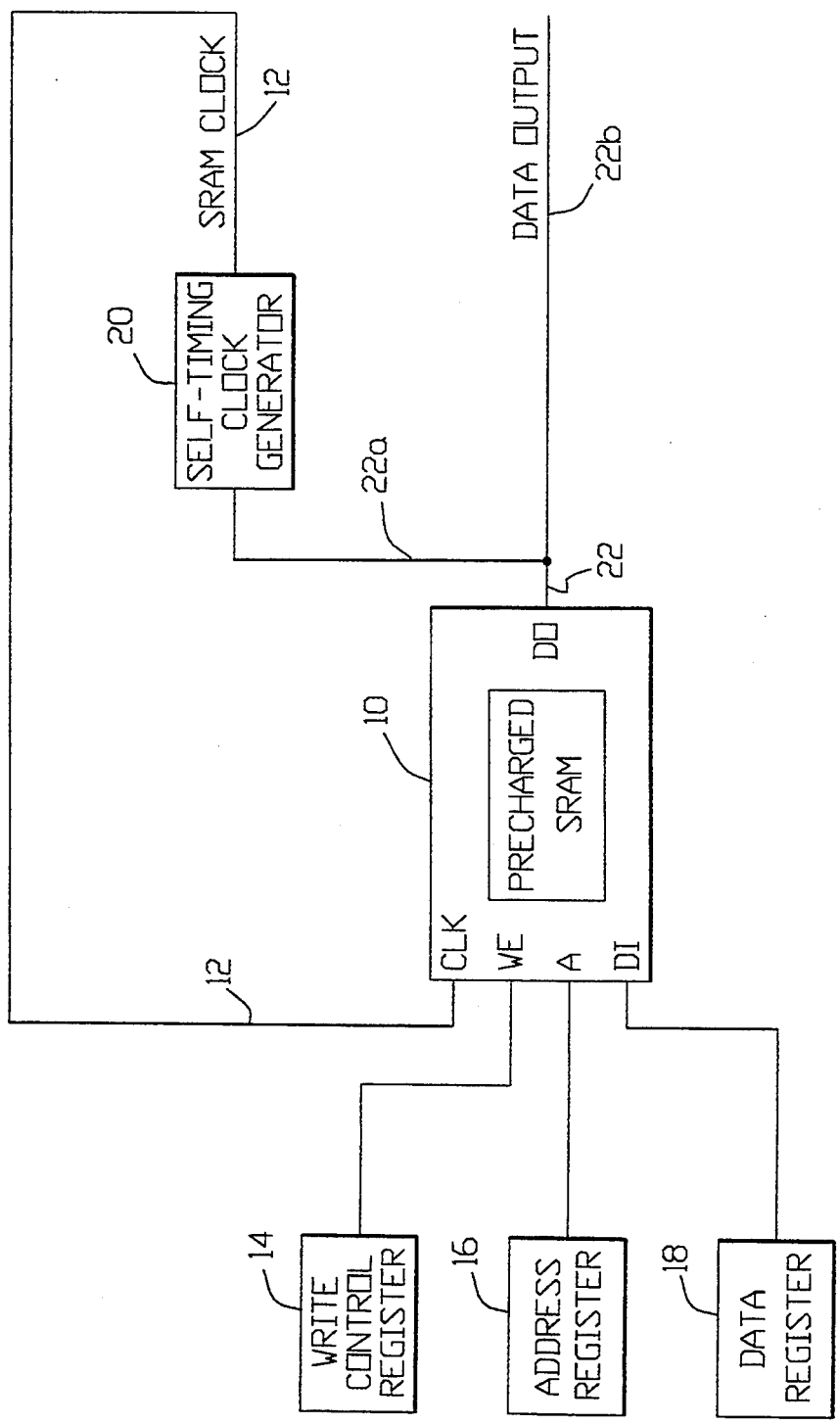
FIG. 1 is a block diagram of the fundamental concept of the invention.

FIG. 1 is a block diagram of the fundamental concept of the invention. A precharged Static Random Access Memory (SRAM) is labeled Precharged SRAM 10, which has four input ports and one output port. The input ports include a clock input (CLK), write enable inputs (WE), address inputs (A), and data inputs (DI), and the outputs include the data outputs (DO). As previously described, a precharged SRAM is a memory device which requires charging (or "precharging") before memory reads or writes can be performed. The Precharged SRAM 10 of the preferred embodiment uses the clock input (CLK) to receive the precharge signal and to clock the device on a low-to-high transition on Line 12. While the signal at the CLK input, labeled SRAM CLOCK on Line 12, is at a low logic level, the Precharged SRAM 10 is in precharge mode, and a clock is provided for memory reads and writes when the signal transitions from a low logic level to a high logic level. The actual logic level which constitutes an active clock or precharge level is of course dependent upon the precharged memory device used, but for the precharged SRAM of the preferred embodiment, a low logic level is used to precharge the memory device and a low-to-high transition provides a triggering edge for memory reads and writes.

FIG. 1 also shows a write control register labeled Write Control Register 14, an address register labeled Address Register 16, and a data register labeled Data Register 18. The Write Control Register 14 is coupled to the WE input of the Precharged SRAM 10, which allows specified bits to be written to the Precharged SRAM depending on the state of the bits in the Write Control Register 14. The Address Register 16 sends the address to the Precharged SRAM which is to be read or written to. The Data Register 18 holds the data to be written to the Precharged SRAM.

The clock generator of FIG. 1, labeled Self-Timing Clock Generator 20, includes circuitry to receive and latch an initial clock signal, and to transmit the resulting SRAM CLOCK signal on Line 12 to the CLK input of the Precharged SRAM 10. The latching mechanism will be reset upon receipt of a signal from the Precharged SRAM 10 on Line 22a indicating that the reading or writing of data is complete. The signal which is sent to the Self-Timing Clock Generator 20 on Line 22a is comprised of a portion of the output signals issued from the DO output of the Precharged SRAM 10 on Line 22. The remaining portion of the output signals comprise the actual data, labeled DATA OUTPUT on Line 22b. The functionality of the Self-Timing Clock Generator 20 will be described in greater detail in the descriptions corresponding to FIGS. 2 and 4.

Figure 2:
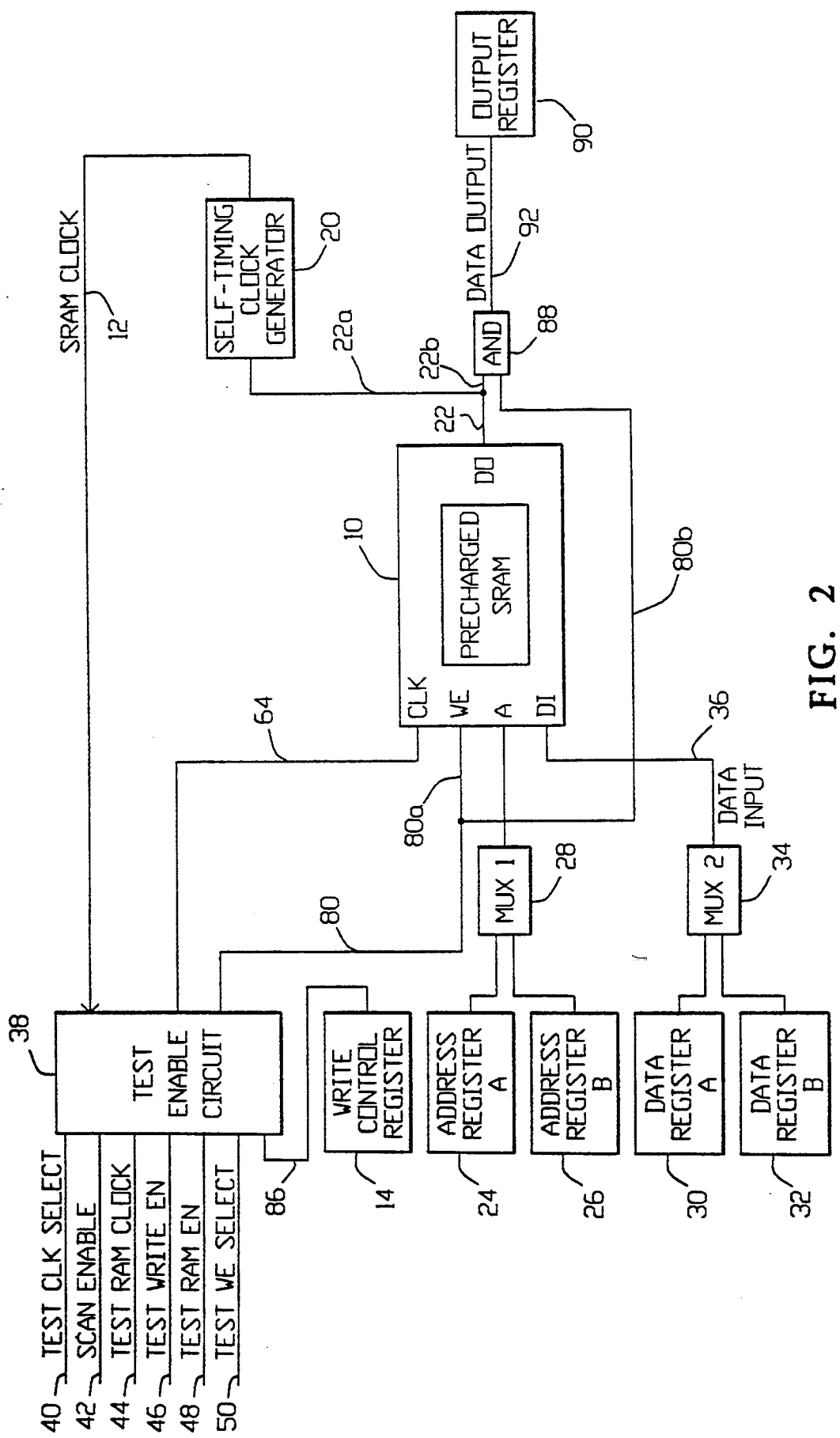
FIG. 2 shows a more detailed block diagram of the preferred embodiment of the present invention.

FIG. 2 shows a more detailed block diagram of the preferred embodiment of the present invention. The Address Register 16 of FIG. 1 is divided into Address Register A 24 and Address Register B 26. A multiplexer, labeled MUX 1 28 then can select an address from Address Register A 24 or Address Register B 26. The address-selected by MUX 1 28 therefore provides the selected address to the Precharged SRAM 10 at input A. Similarly, the Data Register 18 of FIG. 1 is divided into Data Register A 30 and Data Register B 32, and the multiplexer labeled MUX 2 34 selects data from either Data Register A 39 or Data Register B 32. MUX 2 34 provides the selected data to the Precharged SRAM 10 at input DI.

The number of bits associated with the Address Registers A 24 and B 26, the Data Registers A 34 and B 32, and the Write Control Register 14 is dependent upon the size of SRAM used. For instance, in one embodiment of the invention, a 256-word embedded Precharged SRAM was implemented having 21-bit data lengths and one write enable bit for all twenty one bits of data. In another embodiment of the invention, a 1K embedded Precharged SRAM was implemented having 40-bit data lengths and ten write enable bits for controlling the writing of ten groups of four bits of data. The present invention works for various size SRAMs which utilize different sized address and data buses.

Figure 3:
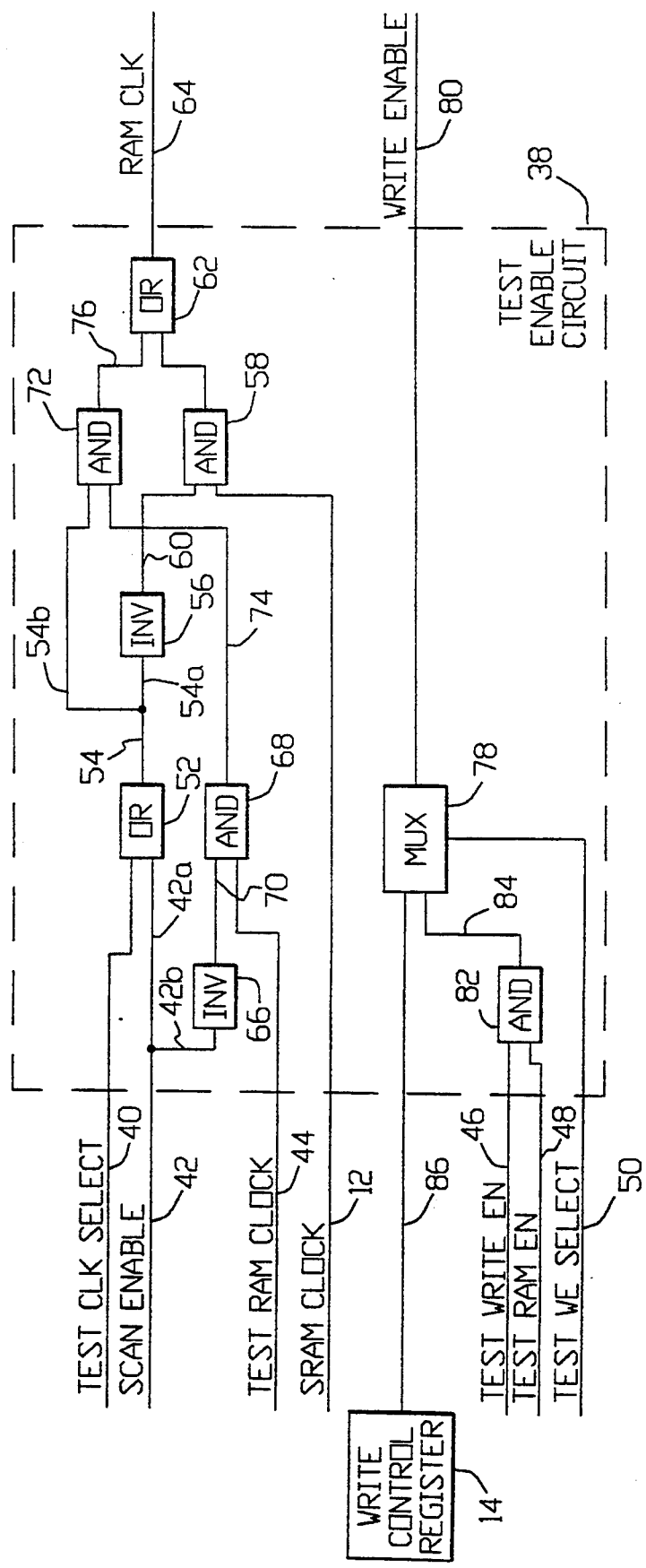
FIG. 3 is a diagram showing the operation of the Test Enable Circuit.

The Write Control Register 14 of the preferred embodiment is not directly coupled to the WE input of the Precharged SRAM 10. Rather, the Write Control Register provides write enable bits to the Test Enable Circuit 38. The Test Enable Circuit 38 also receives six other input signals, labeled TEST CLK SELECT on Line 40, SCAN ENABLE on Line 42, TEST RAM CLOCK on Line 44, TEST WRITE EN on Line 46, TEST RAM EN on Line 48, and TEST WE SELECT on Line FIG. 3 is a diagram showing the operation of the Test Enable Circuit 38. The Test Enable Circuit provides a special clocking mechanism for testing the Precharged SRAM 10. This is accomplished by disabling the SRAM CLOCK signal on Line 12 which is generated by the Self-Timing Clock Generator 20, and allowing an external clock signal, labeled TEST RAM CLOCK on Line 44, to clock the Precharged SRAM 10. The use of this external clock signal provides greater control in testing the Precharged SRAM 10, and SRAM read and write testing can be performed. In the preferred embodiment, the Precharged SRAM 10 is an embedded SRAM, meaning that it is housed within a large gate array. It is important to be able to test the embedded SRAM independently from both the rest of the gate array and the rest of the system so that hardware defects within the SRAM portion of the gate array can be discovered prior to actual use in the system. Therefore, it was desirable to develop a method of disabling the SRAMCLOCK on Line 12, and utilizing external test signals to thoroughly verify that the embedded SRAM was functioning properly. The Test Enable Circuit 38 furnishes this testing capability.

To allow the TEST RAMCLOCK signal on Line 44 to clock the Precharged SRAM 10, the SRAM CLOCK signal on Line 12 must be disabled. When the TEST CLK SELECT signal on Line 40 goes to a high logic level, the output of OR 52 transitions to a high logic level on Line 54, Line 54a, and Line 54b. The signal on Line 54a is inverted by INV 56 so that one input of AND 58 receives a low logic level on Line 60. This causes the output of AND 58 to remain at a low logic level, and thus disables the SRAM CLOCK signal on Line 12 from reaching the OR-gate labeled OR 62. Therefore, when the TEST CLK SELECT signal on Line 40 is active, the SRAM CLOCK signal on Line 12 will no longer be generating the RAM CLK signal on Line 64 at the output of OR 62. However, the TEST RAM CLOCK signal on Line 44 will be able to generate the RAM CLK signal on Line 64. While the SCAN ENABLE signal on Line 42 is at an inactive level (a low logic level in the preferred embodiment), the inverter labeled INV 66 will provide a high logic level at AND 68 via Line 70. Then, the output of AND 68 will directly track the TEST RAM CLOCK signal on Line 44 which is provided at the second input of AND 68. The output of AND 68 is coupled to one input of AND 72 via Line 74. AND 72 will output the signal on Line 74 since the second input of AND 72 is active due to a high logic level on Line 54b. Therefore the TEST RAM CLOCK signal on Line 44 will be transmitted all the way through to the output of AND 72, and then to the input of OR 62 via Line 76. Since the output of AND 58 will be disabled as previously discussed, only the signal on Line 76 will be transmitted through OR 62 to produce the RAM CLK signal on Line 64. In summary, to have the TEST RAM CLOCK signal on Line 44 generate the RAM CLK signal rather than having the SRAM CLOCK signal on Line 12 generate the RAM CLK signal, the TEST CLK SELECT signal on Line 40 must be active (high logic level in the preferred embodiment), and the SCAN ENABLE signal on Line 42 must be inactive (low logic level in the preferred embodiment).

In the preferred embodiment, the system in which the Precharged SRAM 10 resides utilizes a "scan mode". The scan mode allows a "snapshot" of all of the registers in the system to be taken, so that the current state of the system can be determined for maintenance and status purposes. If any of the flip-flops comprising the registers is found to be at an erroneous logic level under a given set of circumstances, recovery action can be initiated and/or the error can be logged. Therefore, scan mode provides a method of reading storage devices, registers and memories, without destroying their contents, and thus checking the accuracy of the hardware in the system.

During a scan operation, test bits can be shifted into each register in the system to define a desired test pattern. The bits are then shifted back out to read the state of the registers in response to the test pattern. In this way, errors can be discovered in the hardware registers. During these scan operations, the RAM CLK signal on Line 64 must be disabled, and an active SCAN ENABLE signal on Line 42 signal performs this disabling function. An active high SCAN ENABLE signal on Line 42 and Line 42a causes OR 52 to generate a high logic level on Line 54a, which is inverted by INV 56 to disable AND 58 due to a low logic level on Line 60. This will disable the SRAM CLOCK signal on Line 12. Also, the active high SCAN ENABLE signal on Line 42 is supplied to INV 66 on Line 42b to disable AND 68 by providing a low logic signal to AND 68 on Line 70. This will disable the TEST RAM CLOCK signal on Line 44. To summarize, a scan operation will cause the SCAN ENABLE signal on Line 42 to become active, which disables the SRAM CLOCK and TEST RAM CLOCK signals on Lines 12 and 44 respectively, which forces the RAM CLK signal on Line 64 to remain at an inactive low logic level. Termination of the scan operation will cause the SCAN ENABLE signal on Line 42 to return to its inactive state, and the SRAM CLOCK signal on Line 12 or the TEST RAM CLOCK signal on Line 44 will be active, depending on the state of the TEST CLK SELECT signal on Line 40.

As previously stated, the Write Control Register 14 of the preferred embodiment is not directly coupled to the WE input of the Precharged SRAM 10, but instead becomes an input to the Test Enable Circuit 38. The Write Control Register 14 is multiplexed by MUX 78 with a write enable signal used for testing. This is done to gain control of the WRITE ENABLE signal on Line 80 in order to allow for externally generated write enable signals during SRAM write testing.

The externally generated write enable signal is labeled TEST WRITE EN on Line 46. This signal is one of two inputs to AND 82. The other input to AND 82 is the TEST RAM EN signal on Line 48. The TEST RAM EN signal, when at an active high logic level, allows the TEST WRITE EN signal on Line 46 to be relayed to MUX 78 via Line 84. When the TEST RAM EN signal on Line 48 is inactive, the TEST WRITE EN signal on Line 46 will not even be present at MUX 78 on Line 84. In order to select between the Write Control Register signals on Line 86 and the TEST WRITE EN signal provided to MUX 78 on Line 84, a multiplexer selection signal must provided. This signal is the TEST WE SELECT signal on Line 50, and will select the write enable bits from the Write Control Register 14 when at one logic state, and will select the TEST WRITE EN signal provided to MUX 78 via Line 84 when at the other logic state. The signals selected by MUX 78 will represent the WRITE ENABLE signals on Line Returning to FIG. 2, the Write Control Register 14 is coupled to the Test Enable Circuit 38 via Line 86. As shown in FIG. 3, the Write Control Register 14 will provide WRITE ENABLE signals on Line 80a to the WE input of the Precharged SRAM 10 when the TEST WE SELECT signal on Line 50 directs MUX 78 to select bits from the Write Control Register 14. The WRITE ENABLE signals indicate to the Precharged SRAM 10 that data will be written to it, and further indicates which bits may be written to at a particular address. As previously stated, one WRITE ENABLE bit on Line 80 may be used to enable writing of all data bits, or multiple WRITE ENABLE bits may be used to enable writing of groups of data bits. In one embodiment of the preferred embodiment, one WRITE ENABLE signal on Line 80 is used for all twenty one bits of data in a 256 word SRAM. In another embodiment of the invention, a 1K embedded Precharged SRAM was implemented having 40-bit data lengths and ten WRITE ENABLE signals for controlling the writing of ten groups of four bits of data. Therefore, there may be one or more WRITE ENABLE signals depending on the specific utilization or the size of the SRAM used.

The WRITE ENABLE signals on Line 80 are also sent on Line 80b to the AND-gate labeled AND 88.

This allows the outputs from the DO output on Line 22b to be enabled or disabled from reaching the Output Register 90 on Line 92. The signals which are allowed to reach the Output Register 90 are labeled DATA OUTPUT on Line 92. The reason for needing AND 88 stems from the fact that the Precharged SRAM 10 of the preferred embodiment does not have a bidirectional data bus. Instead, there is an input data port designated by the DI input on the Precharged SRAM 10, and an output data port designated by the DO output on the Precharged SRAM. Therefore, during a write operation, the written bits can be seen at the output (DO) of the Precharged SRAM 10, even though they have been written into the Precharged SRAM. In order to avoid having these bits latched into the Output Register 90, the active WRITE ENABLE bits on Line 80b coupled to AND 88 will not allow AND 88 to transmit the written bits to the Output Register 90. It should be recognized that where there are multiple WRITE ENABLE signals rather than a single WRITE ENABLE signal, multiple AND-gates would be necessary in place of the single AND 88.

A portion of the data output signals from the DO output of the Precharged SRAM 10 are sent to the Self-Timing Clock Generator 20 on Line 22a. Other inputs to the Self-Timing Clock Generator will be described in the discussion of FIG. 4. The output of the Self-Timing Clock Generator 20 is the SRAM CLOCK signal on Line 12, which is connected to AND 58 in the Test Enable Circuit 38 to ultimately connect to the CLK input of the Precharged SRAM 10 for clocking and precharging the Precharged SRAM. The signals on Line 22a entering the Self-Timing Clock Generator 20 will cause the SRAM CLOCK signal on Line 12 to return to its precharging logic state from its clocking state.

Figure 4:
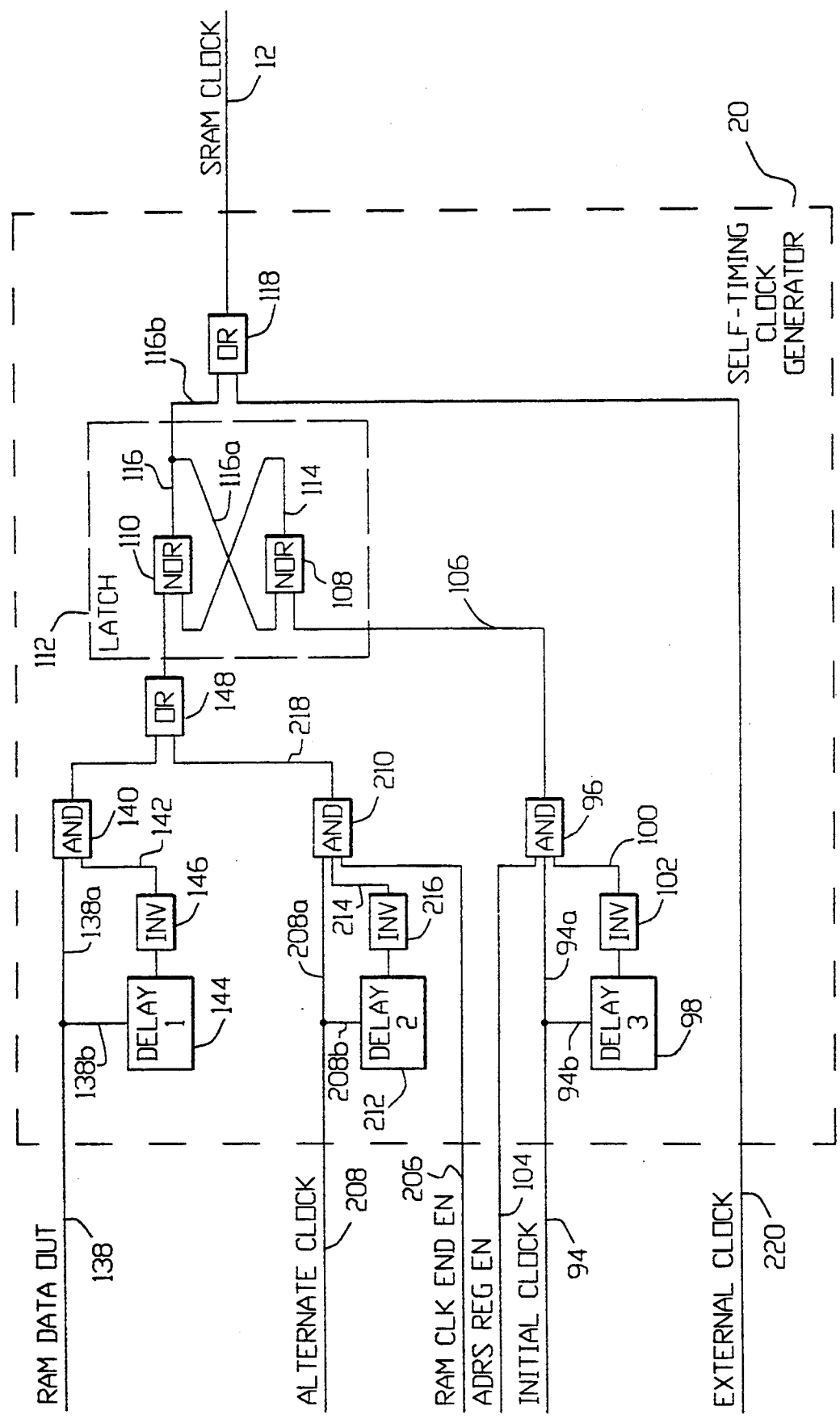
FIG. 4 is a diagram of the Self-Timing Clock Generator.

FIG. 4 is a diagram of the Self-Timing Clock Generator 20. The INITIAL CLOCK signal on Line 94 represents the oscillating clock signal which is used to initiate an active high logic level on the SRAM CLOCK signal on Line 12. The INITIAL CLOCK signal on Line 94 is sent to AND 96 via Line 94a and to DELAY 3 98 on Line 94b. While the INITIAL CLOCK signal is at a low logic level, the AND 96 input connected to Line 94a will be at a low logic level. However, the AND 96 input connected to Line 100 from INV 102 will be at a high logic level since the signal on Line 94b will be at a low logic level. Assuming that the third input to AND 96 from the ADRS REGEN signal on Line 104 is at a high logic level, a high logic level at the INITIAL CLOCK signal on Line 94 will cause the output of AND 96 to transition to a high logic level. The output of AND 96 will remain at a high logic level until the input from Line 100 transitions to a low logic level. This will occur when the INITIAL CLOCK signal on Line 94b has been inverted following the predetermined delay period of DELAY 3 98. In the preferred embodiment, this delay is constructed using a series of inverters, and the sum of the propagation delay times for the inverters generates the desired delay. This delay allows the output of AND 96 to be active for the time specified by the predetermined delay time, and therefore generates a pulse of duration equal to the sum of the predetermined delay and the propagation delay of INV 102.

An active high logic level on the ADRS REGEN signal on Line 104 enables AND 96 to output the pulse of predetermined duration. The ADRS REGEN signal is an address register enable signal which indicates that an address register, such as Address Register A 24 or Address Register B 26, has been enabled to receive an address. This signal can be provided in a variety of ways which would be apparent to one skilled in the art, such as using a software generated signal. The generation method of the ADRS REG EN signal is not pertinent to the present invention and will not be discussed in further detail.

The pulse on Line 106 from AND 96 is sent to the NOR-gate labeled NOR 108 to latch the pulse. NOR 108 and NOR 110 are connected to form a latching circuit, labeled Latch 112, by having the output of each NOR-gate output feed back into an input on the other NOR-gate. The output of NOR 108 is fed to an input of NOR 110 on Line 114, and the output of NOR 110 is fed to an input of NOR 108 on Line 116a. Therefore, where the output of NOR 110 is normally at a low logic level, and thus the signal on Line 116a is at a low logic level, a high pulse on Line 106 will cause the output of NOR 108 on Line 114 to go to a low logic level. This will cause Line 116 at the output of NOR 110 to go to a high logic level, which holds the output of NOR 108 at a low logic level. Line 116b will then be latched at a high logic level, and the output of OR 118, which is the SRAM CLOCK signal on Line 12, will also be latched at a high logic level. To summarize, a high logic level at the INITIAL CLOCK signal on Line 94 will produce an active high pulse of predetermined duration which will latch an active high SRAM CLOCK signal on Line 12. The SRAM CLOCK signal can be transmitted across Line 12 directly to the CLK input of the Precharged SRAM 10 to perform the clocking for a data read or data write function. In the preferred embodiment, the Test Enable Circuit 38 receives the SRAM-CLOCK signal, and redirects it to the Precharged SRAM 10 as the RAM CLOCK signal on Line 64.

A precharged memory chip must be precharged before being clocked. In order to speed operation of the memory accesses, it would be desirable to begin initiating as soon as a memory read or write was complete, rather than waiting for worst case access times to expire. The present invention performs this function. As soon as the memory read or write is complete, the Latch 112 consisting of NOR 108 and NOR 110 is reset so that the SRAM CLOCK signal on Line 12 returns to an active low logic level, which is the logic level required to precharge the Precharged SRAM 10. This allows precharging to begin as soon as possible, which in turn allows the next memory read or write cycle to begin after a predetermined precharging period. Time is therefore saved by beginning the precharging period as soon as the memory read or write is complete, rather than waiting for the expiration of a predetermined worst case memory cycle time.

In order to reset the Latch 112 and cause the SRAM CLOCK signal on Line 12 to return to a low logic level to begin precharging the Precharged SRAM 10, the time at which a memory read or write has completed must be known. In the preferred embodiment, each word of data to be stored in the Precharged SRAM 10 can have one or more dedicated bits which are designated as "memory cycle complete" bits programmed along with the data word. This bit (or bits) is programmed as a logic high at the time of programming so that the data word read or written always has a logic high at a specified bit location. For example, an 8-bit data word could be programmed to have nine bits in which the most significant bit was always programmed to be a binary 1.

Figure 5:
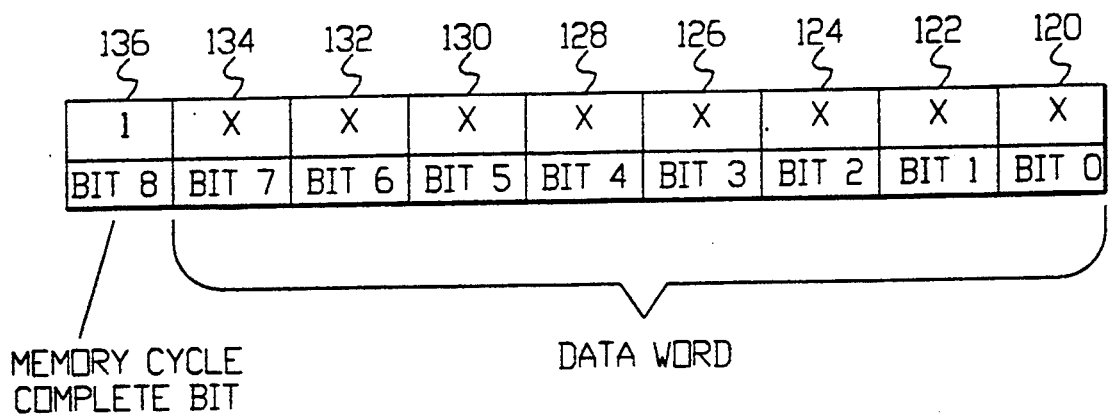
FIG. 5 shows how a data bit can be programmed into a data word to designate that a memory cycle is complete.

FIG. 5 shows how a data bit can be programmed into a data word to designate that a memory cycle is complete. The DATA WORD of FIG. 5 is comprised of eight bits, including Bit 0 120, Bit 1 122, Bit 2 124, Bit 3 126, Bit 4 128, Bit 5 130, Bit 6 132, and Bit 7 134. Bit 8 136 represents the MEMORY CYCLE COMPLETE BIT, and is programmed as an additional bit along with the DATA WORD. The MEMORY CYCLE COMPLETE BIT is always programmed to be a binary 1 (high logic level), so that upon completion of a memory read or write, the Self-Timing Clock Generator 20 can reset the Latch 112 and cause the SRAM CLOCK signal on Line 12 to go to its precharging logic level. It should be recognized that more than one MEMORY CYCLE COMPLETE BIT could be used wherein all MEMORY CYCLE COMPLETE BITS would be set to a predetermined logic level.

Again referring to FIG. 4, the RAMDATA OUT signal on Line 138 is the signal from Bit 8 136 shown in FIG. 5. Therefore, whenever a data word is read from the Precharged SRAM 10, Bit 8 136 goes to a high logic level, and this high logic level is the RAM DATA OUT signal on Line 138. This signal triggers a reset of the Latch 112, and causes the SRAM CLOCK signal on Line 12 to reset to a low logic level, thus causing the Precharged SRAM 10 to begin precharging. Whenever a data word is written to the Precharged SRAM 10, the signal from Bit 8 136 likewise will reset the Latch 112, since the data written to the Precharged SRAM 10 also gets outputted from the Precharged SRAM. This is a characteristic of the SRAM used, since the Precharged SRAM 10 of the preferred embodiment is not a bidirectional SRAM, but rather has a separate input data port and output port. When the RAM DATA OUT signal goes to a high logic level, the first input of AND 140 recognizes a high logic level from Line 138a. The other input of AND 140 will already be supplied with a high logic level from Line 142 due to the inversion of the previously low logic level on Line 138b. Therefore, the output of AND 140 will go to a high logic level. Following a predetermined delay as defined by DELAY 1 144, the currently high logic level on Line 138b will be inverted by INV 146, and the AND 140 will recognize a logic low on Line 142 which will cause the output of AND 140 to go to a low logic level. This results in a low-to-high pulse of duration equal to the predetermined delay plus the propagation delay of INV 146. This pulse will be transmitted through OR 148 to NOR 110 of the Latch 112 circuit. A high pulse at the input of NOR 110 will cause Line 116, Line 116a, and Line 116b to go to a low logic level, which will cause the SRAM CLOCK signal on Line 12 to also drop to a low logic level to put the Precharged SRAM 10 into precharge mode. The low logic level on Line 116a will cause the output of NOR 108 to raise to a high logic level on Line 114. This completes the cycle for the Latch 112, and it will be ready to accept a "set" signal on Line 106 upon the next occurrence of the pulse generated by the INITIAL CLOCK signal on Line 94.

A second method for determining the time at which a memory read or write has completed involves the use of parity bits. Rather than programming a MEMORY CYCLE COMPLETE BIT directly into the data word, the parity bit generated to check the parity Of the data can also be utilized to indicate the completion of a memory read or write. This can more easily be seen by examining FIG. 6.

Figure 6:
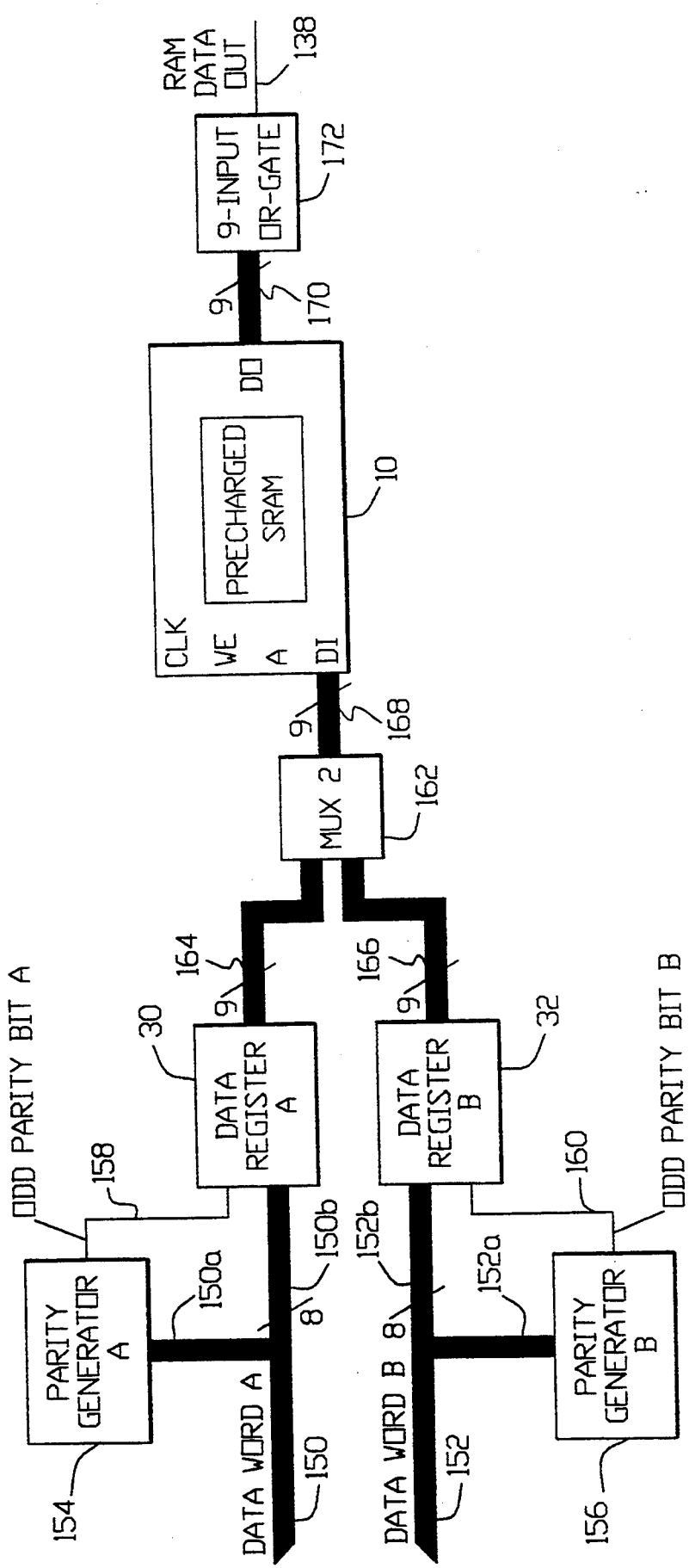
FIG. 6 is a diagram showing the use of parity to indicate the completion of a memory read or write.

FIG. 6 is a diagram showing the use of parity to indicate the completion of a memory read or write. As seen in the diagram, DATA WORD A on Bus 150 and DATA WORD B on Bus 152 each have multiple bits. Eight bits are shown in FIG. 6 for both DATA WORD A on Bus 150 and DATA WORD B on Bus 152. This number of bits is only one of the embodiments of the invention, and it must be recognized that the number of bits in the data word is not limited to eight. The number of bits in the data word is dependent upon the SRAM used in the system, and a smaller or larger number of bits could comprise the data words where a different sized SRAM were used.

DATA WORD A on Bus 150 is coupled to Parity Generator A 154 via Bus 150a and to Data Register A 30 via Bus 150b. Parity Generator A 154 and Parity Generator B 156 are designed to generate odd parity. Therefore, where the total number of set bits is an even number, Parity Generator A 154 or Parity Generator B 156 will set the ODD PARITY BIT A or ODD PARITY BIT B signal on Line 158 or Line 160 respectively, to a high logic level. Where the total number of set bits is an odd number, Parity Generator A 154 or Parity Generator B 156 will set the ODD PARITY BIT A or ODD PARITY BIT B signal on Line 158 or Line 160 respectively, to a low logic level. The eight bits on Line 150b and the ODD PARITY BIT A on Line 158 are inputs to Data Register A 30, and the resulting nine bits are inputs to Mux 2 162 via Line 164. Similarly, the eight bits on Line 152b and the ODD PARITY BIT B on Line 160 are inputs to Data Register B 32, and the resulting nine bits are inputs to Mux 2 162 via Line 166. MUX 2 162 then selects which register to pass the data signals, DATA INPUT, to the DI input of the Precharged SRAM 10 via Line 168. It should be recognized that a single data register could be used without the need for a multiplexer. However, in the preferred embodiment, two data registers were desired.

When the DATA INPUT on Line 168 reaches the Precharged SRAM 10 during a write cycle, the Precharged SRAM will store the eight data bits plus the associated ODD PARITY BIT A or B. These nine bits will also become present at the DO output of the Precharged SRAM 10 during a write cycle. When a read cycle occurs, the stored eight bits plus the associated ODD PARITY BIT A or B will be present at the DO output of the Precharged SRAM 10. Since odd parity is chosen, at least one of the nine bits outputted from the Precharged SRAM on Line 170 must be at a binary 1. Therefore, the 9-Input Or-Gate 172 will output a binary 1 as the RAM DATA OUT signal on Line 138. In summary, through the use of the odd parity generation apparatus implemented in the system already, the RAM DATA OUT signal on Line 138 can be generated, and used to reset the Latch 112 to begin precharging the Precharged SRAM 10.

Figure 7:
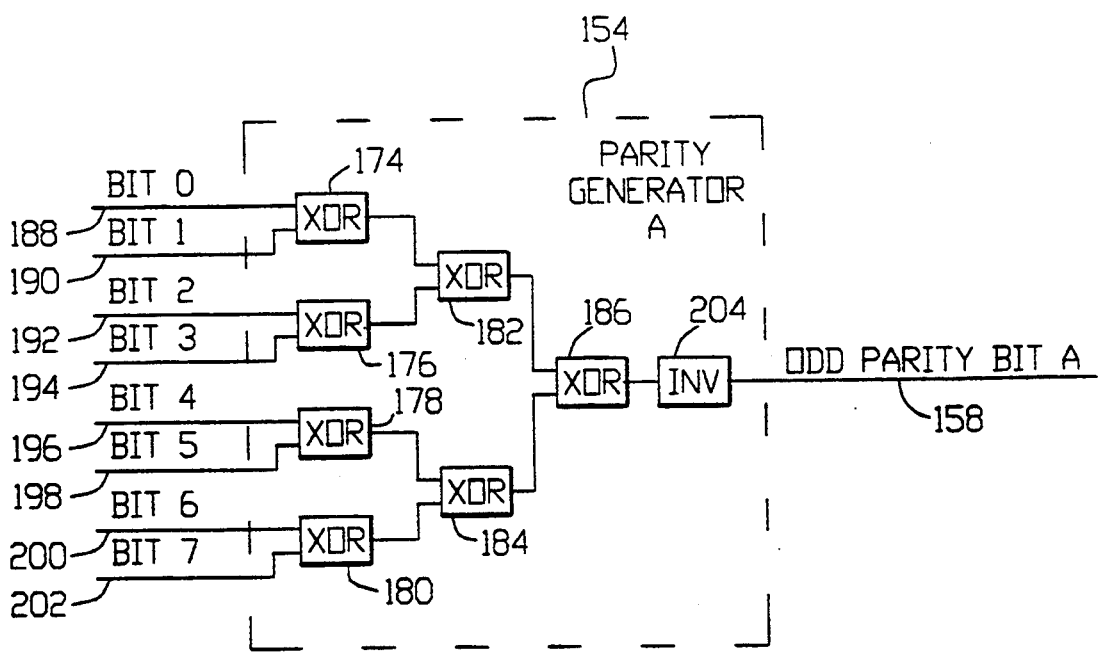
FIG. 7 is a diagram of the Parity Generator A implemented in the preferred embodiment.

FIG. 7 is a diagram of the Parity Generator A 154 implemented in the preferred embodiment. Parity generation is generally known by those skilled in the art, however the parity generation of the preferred embodiment will be briefly described. Parity Generator A 154 and Parity Generator B 156 are identically structured, and therefore only Parity Generator A 154 will be discussed. The operation of Parity Generator B 156 can be determined by analogy to the discussion of the operation of Parity Generator A 154.

The parity generation method employed is an exclusive-OR arrangement utilizing seven exclusive-OR gates and one inverter. These exclusive-OR gates are labeled XOR 174, XOR 176, XOR 178, XOR 180, XOR 182, XOR 184, and XOR 186. BIT 0 on Line 188 and BIT 1 on Line 190 are inputs to XOR 174, BIT 2 on Line 192 and BIT 3 on Line 194 are inputs to XOR 176, BIT 4 on Line 196 and BIT 5 on Line 198 are inputs to XOR 178, and BIT 6 on Line 200 and BIT 7 on Line 202 are inputs to XOR 180. The inverter is labeled INV 204. The operation of an exclusive-OR gate is known to those skilled in the art, and it can be seen that any time an even number of bits are set to a binary 1, the ODD PARITY BIT A or B on Lines 158 or 160 respectively will be set to a high logic level. Similarly, any time an odd number of bits are set to a binary 1, the ODD PARITY BIT A or B on Lines 158 or 160 respectively will be set to a low logic level. This parity generation assures that at least one bit will be set to a high logic level at the input of the 9-Input Or-Gate 172 so that the RAM DATA OUT signal on Line 138 can be set to a high logic level upon the completion of a read or write cycle.

Again referring to FIG. 4, an alternate method for resetting the Latch 112 may be used. This method does not reset the Latch 112 as soon as memory data is available at the output of the Precharged SRAM 10, as in the case previously described. Rather, this method utilizes both an enable signal, labeled RAM CLK END EN on Line 206, and a synchronous clock signal, labeled ALTERNATE CLOCK on Line 208. The RAM CLK END EN signal is a synchronous clock signal used to enable the ALTERNATE CLOCK signal on Line 208 to reset the Latch 112. This alternate method will reset the Latch 112 where the RAM DATA OUT signal on Line 138 failed to reset the Latch 112 for any reason. Furthermore, this method of resetting the Latch 112 could be used in an application that does not require the memory device to enter precharge mode as soon as the self-timing method would.

The alternate method differs from the self-timed method in that the alternate method is "synchronous" versus "asynchronous". The self-timed method asynchronously reset the Latch 112 upon receipt of the RAM DATA OUT signal on Line 138. On the other hand, the alternate method utilizes a synchronous ALTERNATE CLOCK signal on Line 208, and a synchronous RAM CLK END EN signal on Line 206. The Latch 112 is always reset at predetermined triggering edges of the ALTERNATE CLOCK signal. A worst-case timing analysis must be performed for the specific memory device used, so that the SRAM CLOCK signal on Line 12 will be clocked and precharged as required. This results in the SRAM CLOCK signal being at a high logic level for a longer period than where the self-timed mode is used. The advantage of using the self-timed mode is that less power is consumed due to a longer precharge mode (low logic level) period, it allows the minimum precharge time to more easily be met, and the system clock speed can be greater than the alternate method that requires a worst-case timing design.

A pulse is generated from the ALTERNATE CLOCK signal on Line 208 similarly to the pulse generated from the INITIAL CLOCK signal on Line 94. The ALTERNATE CLOCK signal on Line 208 is sent to AND 210 on Line 208a and to DELAY 2 212 on Line 208b. While the ALTERNATE CLOCK signal is at a low logic level, the AND 210 input connected to Line 208a will be at a low logic level. However, the AND 210 input connected to Line 214 from INV 216 will be at a high logic level since the signal on Line 208b will be at a low logic level. Assuming that the third input to AND 210 from the RAM CLK END EN signal on Line 206 is at a high logic level, a high logic level at the ALTERNATE CLOCK signal on Line 208 will cause the output of AND 210 to transition to a high logic level. The output of AND 210 will remain at a high logic level until the input from Line 214 transitions to a low logic level. This will occur when the ALTERNATE CLOCK signal on Line 208b has been inverted following the predetermined delay period of DELAY 2 212. In the preferred embodiment, this delay is constructed using a series of inverters, and the sum of the propagation delay times for the inverters generates the desired delay. This delay allows the output of AND 210 to be active for the time specified by the predetermined delay time, and therefore generates a pulse of duration equal to the sum of the predetermined delay and the propagation delay of INV 216.

The pulse generated on Line 218 is transmitted to the OR-gate labeled OR 148. The output of OR 148 will reset the Latch 112 by transmitting the pulse from Line 218 to NOR 110. The output of NOR 110 will cause a low logic level to be present on Lines 116, 116a, and 116b. OR 118 receives the low logic level from Line 116b, which in turn causes the SRAM CLOCK signal on Line 12 to drop to a low logic level. The low SRAM CLOCK signal will then precharge the Precharged SRAM 10.

A method also exists to bypass the Latch 112 completely. This method allows an external clock signal to control the SRAM CLOCK signal on Line 12. Such a direct clock signal provides a method of testing the Precharged SRAM 10. This external clock can also be used to bypass the Latch 112 where a different clock frequency is desired in a particular system.

The external clock is shown in FIG. 4 as the EXTERNAL CLOCK signal on Line 220. Line 220 is coupled to OR 118 to allow the EXTERNAL CLOCK to be transferred through OR 118 to Line 12. In effect, the EXTERNAL CLOCK signal on Line 220 becomes the SRAM CLOCK signal on Line 12.

Figure 8:
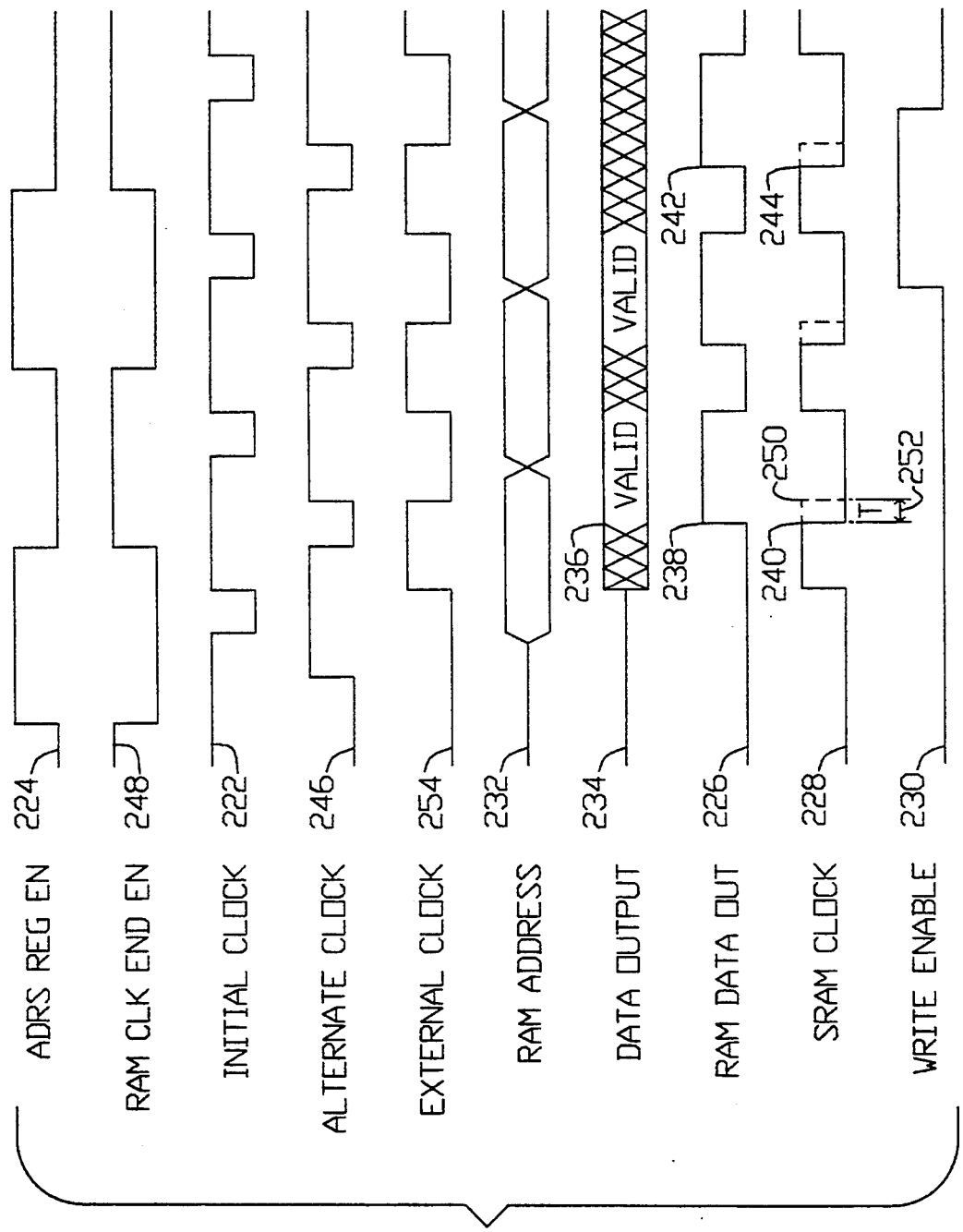
FIG. 8 is a waveform diagram showing the operation of the Self-Timing Clock Generator.

FIG. 8 is a waveform diagram showing the operation of the Self-Timing Clock Generator 20. The self-timing mode of operation utilizes the input signals labeled INITIAL CLOCK on Line 94, ADRS REGEN on Line 104, RAM DATA OUT on Line 138, and SRAM CLOCK on Line 12, as shown in FIG. 4. These signals are shown as waveforms in FIG. 8. The INITIAL CLOCK signal is shown as Waveform 222, the ADRS REGEN signal is shown as Waveform 224, the RAM DATA OUT signal is shown as Waveform 226, and the SRAM CLOCK signal is shown as Waveform 228.

During a read cycle, the WRITE ENABLE signal on Waveform 230 will be at a low logic level. The address to be read is initiated on the high-to-low transition of the INITIAL CLOCK signal on Waveform 222, and this address is labeled RAM ADDRESS on Waveform 232. When the ADRS REGEN signal on Waveform 224 is at a high logic level, a low-to-high transition of the INITIAL CLOCK signal on Waveform 222 will cause valid data to be output as DATA OUTPUT on Waveform 234 at the time represented by Point 236. The RAM DATA OUT signal on Waveform 226 will simultaneously raise to an active high logic level at Point 238. It is this RAM DATA OUT signal which causes the Latch 112 to be reset, causing the SRAM CLOCK signal on Waveform 228 to drop to a low logic level at Point 240. At this time, precharging of the Precharged SRAM 10 will begin.

During a write cycle, the WRITE ENABLE signal on Waveform 230 is at a high logic level. Similar to the read cycle, a low-to-high transition of the INITIAL CLOCK signal on Waveform 222 will result in a high RAM DATA OUT signal on Waveform 226 at Point 242. The RAM DATA OUT signal is still provided, even though a data write is occurring rather than a data read, because the characteristics of the Precharged SRAM 10 are such that data being written is still outputted at the output of the Precharged SRAM 10. Therefore, the RAM DATA OUT signal on Waveform 226 can still reset the Latch 112. When the Latch 112 is reset, the SRAM CLOCK signal on Waveform 228 drops to a low logic level at Point 244 to begin precharging the Precharged SRAM 10.

FIG. 8 demonstrates the benefit of the self-timed mode of operation over the alternate method. The alternate method utilizes the ALTERNATE CLOCK signal on Waveform 246, and the RAM CLK END EN signal on Waveform 248. The INITIAL CLOCK signal on Waveform 222 still sets the Latch 112, but rather than the RAM DATA OUT signal on Waveform 226 resetting the Latch, the ALTERNATE CLOCK signal resets the Latch. Therefore, when the RAM CLK END EN signal on Waveform 248 is at a high logic level, and the ALTERNATE CLOCK signal on Waveform 246 transitions from low-to-high, the Latch 112 is reset. Resetting the Latch causes the SRAM CLOCK signal to drop to a low logic level, at the time indicated by Point 250. As can be seen, the SRAM CLOCK signal drops to a low logic level at a time subsequent to the time it would have dropped to a low logic level had the RAM DATA OUT signal on Waveform 226 been used to reset the Latch 112. This difference in time is labeled T on Line 252. Therefore, using the alternate method, the Precharged SRAM 10 will not begin precharging until a time T (indicated by Line 252) after the DATA OUTPUT of Waveform 234 has become valid (indicated by Point 236).

The EXTERNAL CLOCK signal on Waveform 254 could alternatively be used to control the SRAM CLOCK signal on Waveform 228. The EXTERNAL CLOCK signal of FIG. 8 would generate an SRAM CLOCK signal equivalent to the SRAM CLOCK signal generated by the alternate method described above, which used the ALTERNATE CLOCK signal to reset the Latch 112. It should be recognized that the frequency of the EXTERNAL CLOCK signal could be changed to any frequency which would meet the timing requirements of the Precharged SRAM 10.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. A precharged memory clocking system comprising:
   a precharged static random access memory for storing digital data, and having inputs including a clock input, an address input port, a write enable input, and a data input port;
   a data output port coupled to said precharged static random access memory, and having a first preselected number of bit registers to output said digital data during memory read cycles and memory write cycles within said precharged static random access memory, and having a second preselected number of bit registers to output memory-cycle-complete bits simultaneously with said digital data; and
   a self-timing clock generator, coupled to said clock input of said precharged static random access memory, and further coupled to said data output port, said self-timing clock generator having a latch which is set to a first logic level upon receipt of an active logic level of a digital clock signal and which is reset to a second logic level upon receipt of said memory-cycle-complete bits, and having a clock generator output terminal for transmitting said first logic level and said second logic level to said clock input of said precharged static random access memory,
   whereby receipt of said second logic level at said clock input precharges said precharged static random access memory, and receipt at said clock input of a transition from said second logic level to said first logic level clocks said memory read cycles and said memory write cycles.

2. The precharged memory clocking system as in claim 1, wherein said memory-cycle-complete bits are preprogrammed to a predetermined logic state as part of said digital data.

3. The precharged memory clocking system as in claim 1, further comprising:
   an odd parity generator to receive said digital data, and having a parity output terminal to transmit a parity bit, generated in response to said digital data, to said data input port to be stored with said digital data received by said precharged static random access memory; and
   a multiple input OR-gate coupled to said data output port to receive said digital data outputted by said data output port and to receive said parity bit stored with said digital data, and having a memory-cycle-complete output terminal coupled to said self-timing clock generator to output one memory-cycle-complete bit in response to said digital data and said parity bit, to reset said latch to said second logic level.

4. The precharged memory clocking system as in claim 1, further comprising test enable means coupled to said self-timing clock generator and said precharged static random access memory, for intercepting said first logic level and said second logic level from said clock generator output terminal, and for providing in place thereof a test clock signal to the clock input of said precharged static random access memory for testing operation of said self-timing clock generator.

5. The precharged memory clocking system as in claim 4, wherein said test enable means intercepts a write enable signal to the write enable input of said precharged static random access memory, and provides in place thereof a test write enable signal to the write enable input for testing said self-timing clock generator during write operations of said precharged static random access memory.

6. A digital clock generation system for use in clocking a precharged memory device, the precharged memory device having a plurality of address inputs for receiving a digital address, data inputs for receiving digital input data, write enable inputs for receiving write enable signals, data outputs for outputting digital output data, and a clock input, whereby a precharge signal at the clock input puts the precharged memory device in precharge mode, and a clock signal transitioning to the opposite logic level as that of the precharge signal supplies the clock input with a triggering edge for reading and writing the precharged memory device, the digital clock generation system comprising:

initial clock pulse latching means for receiving and latching an active clocking edge of an initial clock pulse, and for providing a latched clock signal to the clock input of the precharged memory device in response to said initial clock pulse;

memory completion signal generation means coupled to the precharged memory device for generating a completion signal indicating the completion of a memory read or write;

latch reset means coupled to said memory completion signal generation means for receiving said completion signal, and further coupled to said initial clock pulse latching means for driving said latched clock signal to the opposite logic level in response to said completion signal, thereby causing said initial clock pulse latching means to provide a latched precharge signal to the clock input of the precharged memory device.

7. A digital clock generation system as in claim 6, wherein said memory completion signal generation means includes one or more preprogrammed bits which comprise part of the digital input data, and having completion signal output registers to output said completion signal in response to said preprogrammed bits.

8. A digital clock generation system as in claim 6, wherein said memory completion signal generation means comprises:

odd parity generation means for receiving the digital input data and generating an odd parity bit in response thereto; and means for logically OR'ing the digital input data and said odd parity bit, and for outputting said completion signal in response to said logical OR function.

9. A digital clock generation system as in claim 6, further comprising:

alternate clocking means for generating an alternate reset signal; and reset selection means coupled to said memory completion signal generation means and to said alternate clocking means, for receiving said completion signal and said alternate reset signal respectively, and for generating a reset signal by selecting said completion signal or said alternate reset signal in response to one or more reset selection bits, and wherein said reset selection means is coupled to said latch reset means for providing said latch reset means with said reset signal to generate said latched precharge signal.

10. A digital clock generation system as in claim 6, further comprising:

external clocking means for generating an external clock signal; and clock input selection means coupled to said initial clock pulse latching means and to said external clocking means, for receiving said latched clock signal and said external clock signal respectively, and for allowing the clock input to be driven by said external clock signal when said latched clock signal is not present, and for allowing the clock input to be driven by said latched clock signal when said external clock signal is not present.

11. A self-timing clock generation system for use in clocking a precharged memory device, the precharged memory device having a clock input for receiving a triggering clock edge for reading and writing the precharged memory device, and for receiving a precharge signal for precharging the precharged memory device, the self-timing clock generation system comprising:

an electrical transmission line for transmitting an initial clock signal;

a latch circuit having a set input and a reset input, said set input coupled to said electrical transmission line to receive and latch an active clocking edge of said initial clock signal, and having a latch output to provide the triggering clock edge to the clock input of the precharged memory device in response to said active clocking edge of said initial clock signal; and a bit register coupled to one of a plurality of data lines to receive a predetermined completion bit upon recognition of valid data during a memory access cycle, and coupled to said reset input of said latch circuit to provide said latch circuit with said predetermined completion bit to provide the precharge signal to the clock input of the precharged memory device.

12. A method of providing a self-timed clock signal to a precharged memory device, wherein the precharged memory device includes a clock input and a plurality of data inputs and data outputs, the method comprising the steps of:

(a) providing an initial clock signal;

(b) latching the active logic level of said initial clock signal to generate a latched clock signal;

(c) providing a triggering clock edge with the active transitioning edge of said latched clock signal to the clock input of the precharged memory device for initiating reads and writes of the precharged memory device;

(d) generating a memory access completion signal to indicate completion of said reads and writes of the precharged memory device;

(e) resetting said latched clock signal with said memory access completion signal so that said latched clock signal transitions to its inactive logic level;

(f) precharging the precharged memory device during the period that the latched clock signal is reset to its inactive logic level; and (g) repeating steps (a) through (f) for each precharged memory device read or write cycle.

13. The method as defined by claim 12, wherein said step of generating a memory access completion signal comprises preprogramming a predetermined logic state into one bit of a multiple-bit data word.

14. The method as defined by claim 12, wherein said step of generating a memory access completion signal comprises the steps of:

generating an odd parity bit in response to a multiple-bit data word; and performing a logical OR function on said generated odd parity bit and all bits comprising said multiple-bit data word.

\* \* \* \* \*